US010608597B2

(12) United States Patent
Honda et al.

(10) Patent No.: US 10,608,597 B2
(45) Date of Patent: *Mar. 31, 2020

(54) POWER AMPLIFIER CIRCUIT

(71) Applicant: Murata Manufacturing Co., Ltd., Kyoto (JP)

(72) Inventors: Yuri Honda, Kyoto (JP); Fumio Harima, Kyoto (JP); Satoshi Tanaka, Kyoto (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 0 days.

This patent is subject to a terminal disclaimer.

(21) Appl. No.: 16/278,242

(22) Filed: Feb. 18, 2019

(65) Prior Publication Data

US 2019/0181808 A1    Jun. 13, 2019

Related U.S. Application Data

(63) Continuation of application No. 15/904,970, filed on Feb. 26, 2018, now Pat. No. 10,291,187.

(30) Foreign Application Priority Data

Feb. 27, 2017   (JP) .................. 2017-035459

(51) Int. Cl.
*H03F 3/04*   (2006.01)
*H03F 1/56*   (2006.01)
(Continued)

(52) U.S. Cl.
CPC ............ *H03F 1/56* (2013.01); *H03F 1/302* (2013.01); *H03F 3/19* (2013.01); *H03F 3/21* (2013.01);
(Continued)

(58) Field of Classification Search
CPC ..... H03F 1/56; H03F 3/21; H03F 3/19; H03F 1/302; H03F 2200/18; H03F 2200/222; H03F 2200/451
(Continued)

(56) References Cited

U.S. PATENT DOCUMENTS 6,784,743 B2    8/2004  Taniguchi et al.
10,291,187 B2 *  5/2019  Honda .................. H03F 1/302
(Continued)

FOREIGN PATENT DOCUMENTS

JP    2003-324325 A    11/2003
KR   10-2014-0064178 A    5/2014
(Continued)

*Primary Examiner* — Khanh V Nguyen
*Assistant Examiner* — Khiem D Nguyen
(74) *Attorney, Agent, or Firm* — Pearne & Gordon LLP (57) ABSTRACT

A power amplifier circuit includes an amplifier transistor having a base, a collector, a bias circuit, and a first resistance element connected between the base of the amplifier transistor and the bias circuit. The bias circuit includes a voltage generation circuit, a first transistor having a base to which a first direct-current voltage is supplied, and an emitter from which the bias current or voltage is supplied, a second transistor having a base to which a second direct-current voltage is supplied, and an emitter connected to the emitter of the first transistor, a signal supply circuit disposed between the base of the amplifier transistor and the base of the second transistor, and an impedance circuit disposed between the base of the first transistor and the base of the second transistor.

10 Claims, 7 Drawing Sheets

(51) Int. Cl.
*H03F 3/19* (2006.01)
*H03F 3/21* (2006.01)
*H03F 1/30* (2006.01)

(52) U.S. Cl.
CPC .... *H03F 2200/18* (2013.01); *H03F 2200/222* (2013.01); *H03F 2200/451* (2013.01)

(58) Field of Classification Search
USPC .......................... 330/296, 297, 285, 136, 298
See application file for complete search history.

(56) References Cited

U.S. PATENT DOCUMENTS

2007/0222033 A1  9/2007  Ariie et al.
2014/0139291 A1  5/2014  Won et al.
2014/0167861 A1  6/2014  Song

FOREIGN PATENT DOCUMENTS

KR  10-2014-0077598 A  6/2014
WO     2006057104 A1   6/2006

\* cited by examiner

POWER AMPLIFIER CIRCUIT

This is a continuation of U.S. patent application Ser. No. 15/904,970 filed on Feb. 26, 2018 which claims priority from Japanese Patent Application No. 2017-035459 filed on Feb. 27, 2017. The contents of these applications are incorporated herein by reference in their entireties.

BACKGROUND

The present disclosure relates to a power amplifier circuit. A power amplifier circuit to be incorporated in a mobile communication device such as a cellular phone typically includes a bipolar transistor as an amplifier. Bipolar transistors have a thermal positive feedback characteristic in which as the temperature of the element increases, collector current increases, which further raises the temperature of the element, leading to a further increase in collector current. To suppress an increase in collector current caused by an increase in temperature, a configuration is available in which, for example, a resistance element (hereinafter also referred to as a ballast resistor) is connected between a base of a bipolar transistor and a base bias voltage supply terminal. In this configuration, a voltage drop across the ballast resistor suppresses an increase in base current, and, as a result, an increase in collector current is also suppressed.

In a configuration including a ballast resistor, when base current increases with an increase in the power level of an input signal, voltage drop increases across the ballast resistor, which causes a decrease in base voltage. As a result, power gain may decrease with the amplitude of the collector current, which is independent of the amplitude of the base current, and the linearity of the amplifier may deteriorate. To prevent the deterioration of the linearity, for example, Japanese Unexamined Patent Application Publication No. 2003-324325 discloses a power amplifier including a capacitance element between a signal input terminal and a base bias voltage supply terminal. With this configuration, power supplied from the signal input terminal can be transmitted to the base bias voltage supply terminal. Thus, a reduction in base voltage is suppressed, and linearity is improved.

In the configuration disclosed in Japanese Unexamined Patent Application Publication No. 2003-324325, the capacitance element connected between the signal input terminal and the base bias voltage supply terminal may be part of a matching circuit viewed from the signal input terminal. That is, the capacitance element may affect matching between the input impedance of an amplifier and the output impedance of a circuit preceding the amplifier.

BRIEF SUMMARY

Accordingly, the present disclosure provides power amplifier circuit that performs impedance matching between an amplifier and a preceding circuit with improved linearity of power gain.

According to embodiments of the present disclosure, a power amplifier circuit includes an amplifier transistor having a base or gate to which an input signal is supplied, and a collector or drain from which an amplified signal obtained by amplifying the input signal is output, a bias circuit that supplies a bias current or voltage to the base or gate of the amplifier transistor, and a first resistance element connected in series between the base or gate of the amplifier transistor and the bias circuit. The bias circuit includes a voltage generation circuit that generates a first direct-current voltage, a first transistor having a base or gate to which the first direct-current voltage is supplied, and an emitter or source from which the bias current or voltage is supplied to the base or gate of the amplifier transistor via the first resistance element, a second transistor having a base or gate to which a second direct-current voltage is supplied, and an emitter or source connected to the emitter or source of the first transistor, a signal supply circuit disposed between the base or gate of the amplifier transistor and the base or gate of the second transistor and configured to supply the input signal to the base or gate of the second transistor, and an impedance circuit disposed between the base or gate of the first transistor and the base or gate of the second transistor.

According to embodiments of the present disclosure, it may be possible to provide a power amplifier circuit that performs impedance matching between an amplifier and a preceding circuit with improved linearity of power gain.

Other features, elements, characteristics and advantages of the present disclosure will become more apparent from the following detailed description of embodiments of the present disclosure with reference to the attached drawings.

DETAILED DESCRIPTION

Embodiments of the present disclosure will be described hereinafter with reference to the drawings. The same or substantially the same elements are assigned the same numerals and are not repeatedly described.

Figure 1:
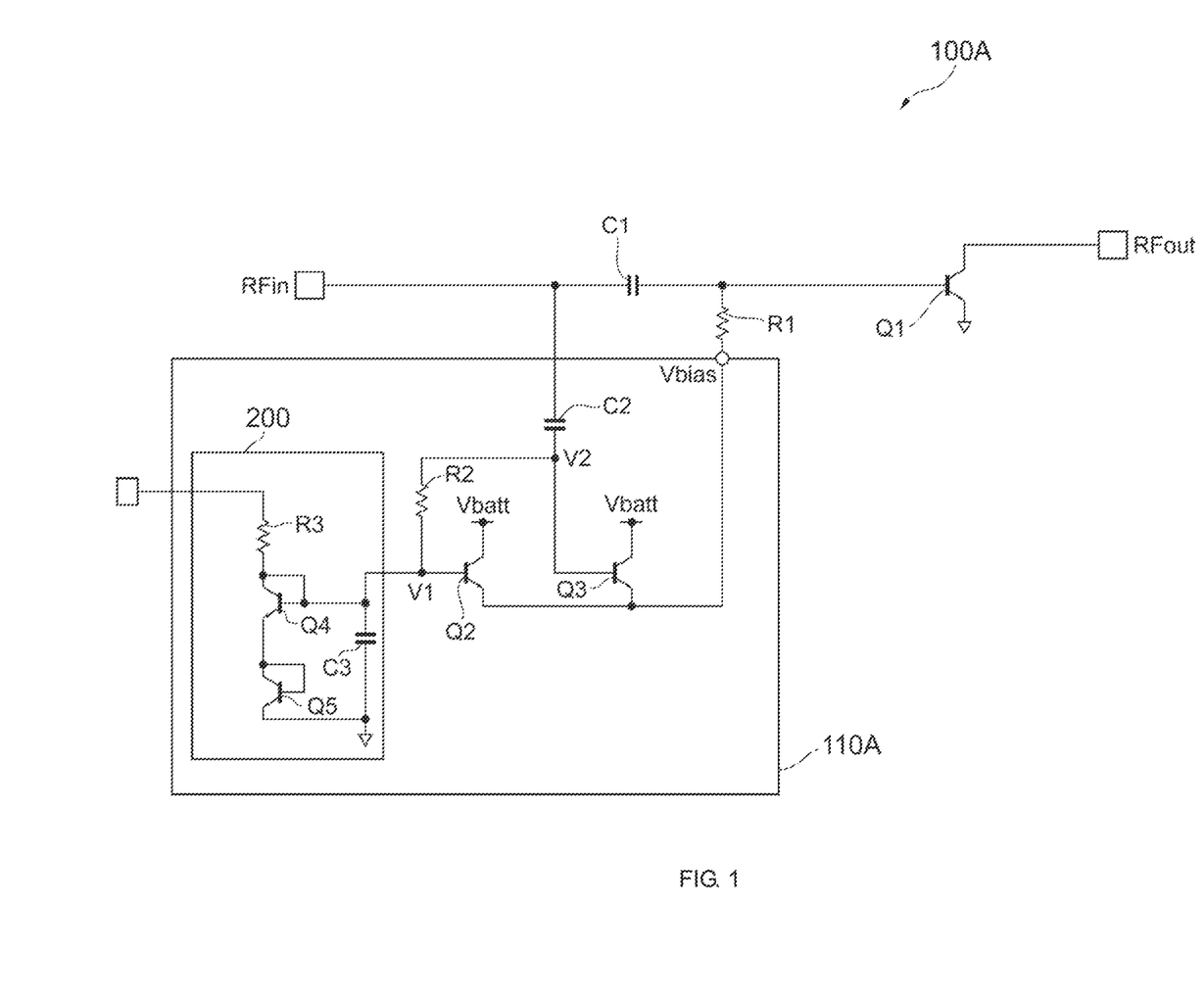
FIG. 1 is a diagram illustrating an example configuration of a power amplifier circuit according to a first embodiment of the present disclosure.

FIG. 1 is a diagram illustrating an example configuration of a power amplifier circuit 100A according to a first embodiment of the present disclosure. The power amplifier circuit 100A illustrated in FIG. 1 is incorporated in a cellular phone, for example, and is used to amplify the power of a radio-frequency (RF) signal to be transmitted to a base station. The power amplifier circuit 100A amplifies the power of signals complying with communication standards such as second generation mobile communication systems (2G), third generation mobile communication systems (3G), fourth generation mobile communication systems (4G), fifth generation mobile communication systems (5G), Long Term Evolution Frequency Division Duplex (LTE-FDD), LTE Time Division Duplex (LTE-TDD), LTE-Advanced, and LTE-Advanced Pro. The power amplifier circuit 100A may amplify the power of signals complying with other communication standards.

The power amplifier circuit 100A includes a transistor Q1, a bias circuit 110A, a capacitor C1, and a resistance element R1. The power amplifier circuit 100A amplifies an input signal RFin supplied to an input terminal and outputs an amplified signal RFout from an output terminal. These constituent elements will be described in detail hereinafter.

The transistor Q1 (amplifier transistor) has a collector to which a power supply voltage (not illustrated) is supplied, a base connected in series with the capacitor C1, and an emitter grounded. The input signal RFin is supplied to the base of the transistor Q1 from outside the power amplifier circuit 100A via the capacitor C1, and a bias current or voltage is also supplied to the base of the transistor Q1 from the bias circuit 110A via the resistance element R1. Thus, the amplified signal RFout, which is obtained by amplifying the input signal RFin, is output from the collector of the transistor Q1. The gain of the transistor Q1 may be controlled in accordance with, for example, the bias current or voltage supplied from the bias circuit 110A.

The transistor Q1 may have a configuration in which a plurality of unit transistors (fingers) is connected in parallel (i.e., a multi-finger configuration).

The transistor Q1 is described herein as a bipolar transistor such as a heterojunction bipolar transistor (HBT) but is not limited to any specific type. The transistor Q1 may be a field effect transistor (FET) instead of a bipolar transistor. Examples of the FET include a metal-oxide-semiconductor field effect transistor (MOSFET), a junction field effect transistor (JFET), and a metal-semiconductor field effect transistor (MESFET). When an FET is used instead of a bipolar transistor, collector, base, and emitter are respectively read as drain, gate, and source. The same applies to other transistors described below.

The bias circuit 110A generates a bias current or voltage and supplies the bias current or voltage to the base of the transistor Q1. The configuration of the bias circuit 110A will be described in detail below.

The capacitor C1 has a first end connected to the input terminal and a second end connected to the base of the transistor Q1. The capacitor C1 removes the direct-current (DC) component of the input signal RFin.

The resistance element R1 (first resistance element) is connected in series between the base of the transistor Q1 and the output of the bias circuit 110A. Specifically, the resistance element R1 has a first end connected to the base of the transistor Q1 and a second end connected to emitters of transistors Q2 and Q3. The resistance element R1 is a ballast resistor for preventing thermal positive feedback of the transistor Q1. That is, the transistor Q1 has a thermal positive feedback characteristic in which as the temperature of the transistor element increases, collector current increases, which raises the temperature of the transistor element, leading to a further increase in collector current. Thus, for example, if a multi-finger configuration in which a plurality of unit transistors are connected in parallel does not include the resistance element R1, the flow of collector current concentrates on some transistors, which may produce thermal runaway. As a result, such transistors may be broken. In the power amplifier circuit 100A, the resistance element R1 is included. Thus, if the base current in the transistor Q1 increases, a voltage drop occurs across the resistance element R1, which suppresses the increase of the base current. Therefore, an increase in the collector current in the transistor Q1 is suppressed.

Next, the configuration of the bias circuit 110A will be described in detail. The bias circuit 110A includes, for example, a voltage generation circuit 200, the transistors Q2 and Q3, a capacitor C2, and a resistance element R2.

The voltage generation circuit 200 includes, for example, a resistance element R3, transistors Q4 and Q5, and a capacitor C3. The resistance element R3 has a first end to which a predetermined current or voltage is supplied from outside the voltage generation circuit 200, and a second end connected to a collector of the transistor Q4. The transistors Q4 and Q5 are connected in series. Specifically, the collector and base of the transistor Q4 (fourth transistor) are connected (hereinafter also referred to as diode-connected). The collector of the transistor Q4 is connected to the second end of the resistance element R3, and an emitter of the transistor Q4 is connected to a collector of the transistor Q5. The transistor Q5 (fifth transistor) is diode-connected, and an emitter of the transistor Q5 is grounded. The capacitor C3 has a first end connected to the base of the transistor Q4 and a second end grounded. The capacitor C3 is used to alternating current (AC) ground the base of the transistor Q2.

In the voltage generation circuit 200, with the configuration described above, a voltage V1 (first direct-current voltage) having a predetermined level (for example, about 2.8 V) is generated at the collector of the transistor Q4. A diode element may be used instead of each of the transistors Q4 and Q5.

The transistor Q2 (first transistor) has a collector to which a power supply voltage Vbatt is supplied, a base to which the voltage V1 is supplied, and an emitter connected to the second end of the resistance element R1. The transistor Q2 supplies a bias current or voltage to the base of the transistor Q1 via the resistance element R1. The emitter voltage of the transistor Q2 is represented as a voltage Vbias.

The resistance element R2 (second resistance element) has a first end connected to the base of the transistor Q2 and a second end connected to a base of the transistor Q3. The resistance element R2 outputs, from the second end thereof, a voltage V2 (second direct-current voltage) responsive to the voltage V1 supplied to the first end thereof, and supplies the voltage V2 to the base of the transistor Q3 as a bias voltage. The voltage V2 is lower than the voltage V1, for example. The bias voltage of the transistor Q3 can be adjusted by adjusting the resistance value of the resistance element R2. The resistance element R2 is a specific example of an impedance circuit.

The capacitor C2 is connected in series between the base of the transistor Q1 and the base of the transistor Q3. Specifically, the capacitor C2 has a first end connected to a node between the input terminal and the first end of the capacitor C1, and a second end connected to the base of the transistor Q3 and the second end of the resistance element R2. The capacitor C2 removes the DC component of the input signal RFin, detects the AC component of the input signal RFin, and supplies the resulting AC component of the input signal RFin to the base of the transistor Q3. The capacitor C2 is a specific example of a signal supply circuit. The first end of the capacitor C2 may be connected to a node of the second end of the capacitor C1 and the first end of the resistance element R1.

The transistor Q3 (second transistor) has a collector to which the power supply voltage Vbatt is supplied, a base to which the voltage V2 (second direct-current voltage) responsive to the voltage V1 is supplied, and an emitter connected to the emitter of the transistor Q2. The base of the transistor Q3 is supplied with the AC component of the input signal RFin via the capacitor C2. Thus, the transistor Q3 is biased by the voltage V2 and outputs a signal obtained by amplifying the input signal RFin to the emitter of the transistor Q2. The bias voltage supplied to the transistor Q3 can be adjusted to bias the transistor Q3 in such a manner that, for example, the transistor Q3 is turned off when the power level of the input signal RFin is comparatively low and is turned on when the power level of the input signal RFin is comparatively high.

Next, the functions of the capacitor C2, the resistance element R2, and the transistor Q3 will be described with reference to FIGS. 2A to 2C and FIGS. 3A to 3C. In the following description, a power amplifier circuit of a comparative example has a configuration that does not include the capacitor C2, the resistance element R2, or the transistor Q3, unlike the power amplifier circuit 100A illustrated in FIG. 1. In the comparative example, constituent elements corresponding to the constituent elements of the power amplifier circuit 100A are assigned similar numerals, for convenience of illustration.

Figure 2A:
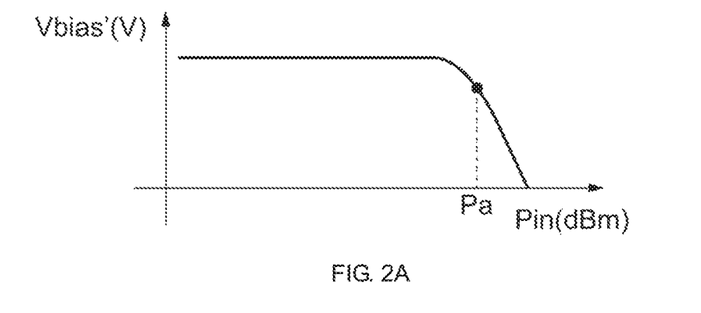
FIG. 2A is a graph depicting a relationship between an input power and a voltage in a power amplifier circuit of a comparative example.
Figure 2B:
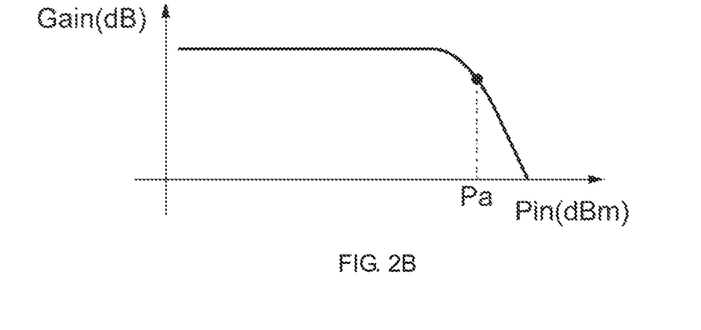
FIG. 2B is a graph depicting a gain characteristic of the power amplifier circuit of the comparative example.
Figure 2C:
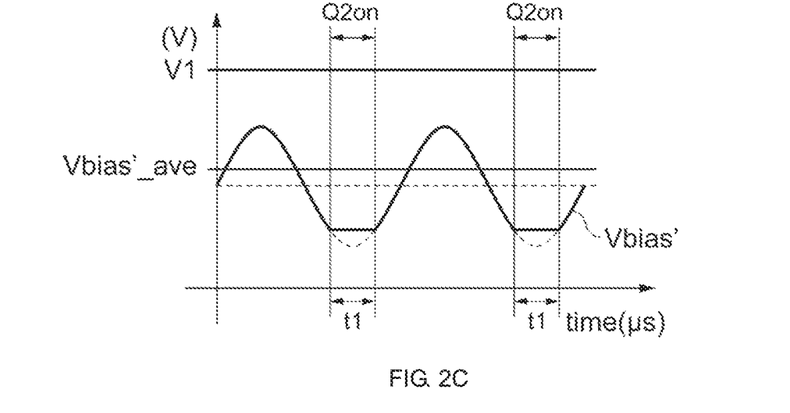
FIG. 2C is a graph depicting a change in voltage with time at an input power level in the power amplifier circuit of the comparative example.
Figure 3A:
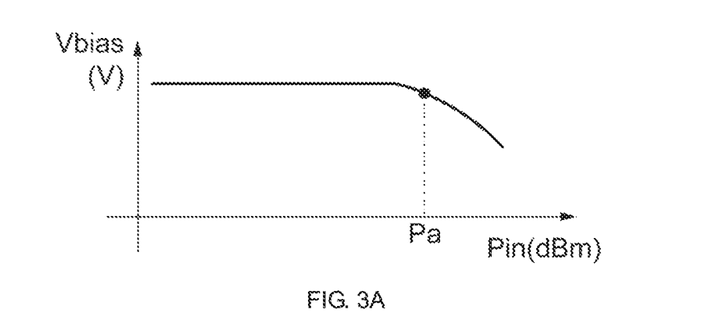
FIG. 3A is a graph depicting a relationship between an input power and a voltage in the power amplifier circuit according to the first embodiment of the present disclosure.
Figure 3B:
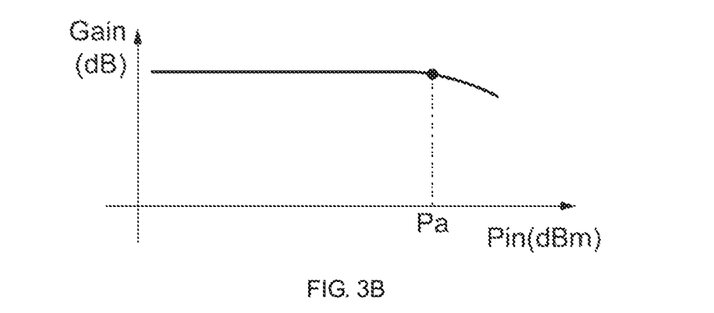
FIG. 3B is a graph depicting a gain characteristic of the power amplifier circuit according to the first embodiment of the present disclosure.
Figure 3C:
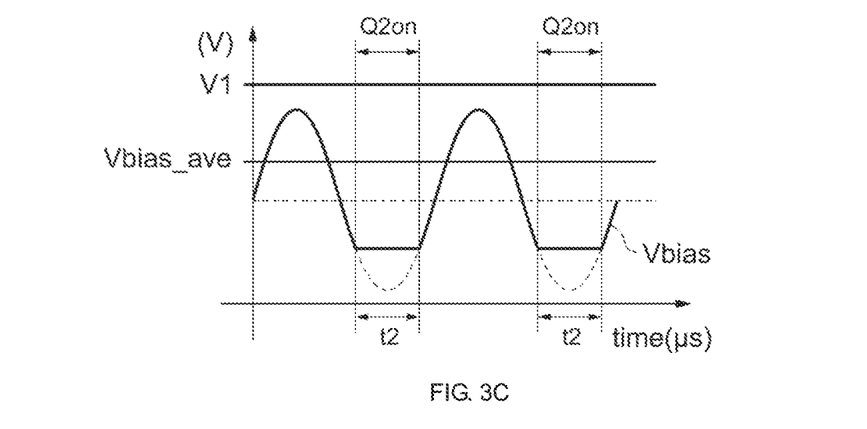
FIG. 3C is a graph depicting a change in voltage with time at an input power level in the power amplifier circuit according to the first embodiment of the present disclosure.

FIG. 2A is a graph depicting a relationship between an input power Pin and a voltage Vbias' in the power amplifier circuit of the comparative example, FIG. 2B is a graph depicting a gain characteristic of the power amplifier circuit of the comparative example, and FIG. 2C is a graph depicting a change in the voltage Vbias' with time at an input power level Pa in the power amplifier circuit of the comparative example. FIG. 3A is a graph depicting a relationship between the input power Pin and the voltage Vbias in the power amplifier circuit according to the first embodiment of the present disclosure, FIG. 3B is a graph depicting a gain characteristic of the power amplifier circuit according to the first embodiment of the present disclosure, and FIG. 3C is a graph depicting a change in the voltage Vbias with time at the input power level Pa in the power amplifier circuit according to the first embodiment of the present disclosure. The voltage Vbias' in the comparative example corresponds to the voltage Vbias in the power amplifier circuit 100A.

As illustrated in FIG. 2A, the voltage Vbias' in the comparative example rapidly decreases when the input power Pin exceeds a predetermined level. Such a rapid decrease in the voltage Vbias' is caused by the following mechanism: In accordance with an increase in the base current in the transistor Q1, a voltage drop occurs across the resistance element R1, which leads to a decrease in the base voltage of the transistor Q1. Thus, as illustrated in FIG. 2B, a decrease in power gain (hereinafter also referred to as gain compression) occurs with the amplitude of the collector current, which is independent of the amplitude of the base current, and linearity deteriorates.

FIG. 2C depicts the waveform of the voltage Vbias' when the input power Pin has a comparatively high level (the input power level Pa illustrated in FIG. 2B). An input signal is propagated to the emitter of the transistor Q2 via the resistance element R1, and the voltage Vbias' has a waveform that changes in amplitude. If the emitter voltage of the transistor Q2 decreases in accordance with the signal amplitude of the input signal, the transistor Q2 is brought into an on-state. During a period over which the transistor Q2 is in the on-state (time t1), the waveform of the voltage Vbias' remains at a predetermined value. Specifically, the voltage Vbias' is kept at a value obtained by subtracting the base-emitter voltage (Vbe2) of the transistor Q2 from the base voltage (V1) of the transistor Q2, i.e., at the value given by V1−Vbe2.

In the power amplifier circuit 100A, in contrast, an input signal detected by the capacitor C2 is supplied to the transistor Q3, and the transistor Q3 amplifies the input signal and outputs the amplified signal to the emitter of the transistor Q2. Thus, particularly when the power level of the input signal is comparatively high, the voltage amplitude on the emitter of the transistor Q2 is larger than that in the comparative example (see FIGS. 2C and 3C). In the power amplifier circuit 100A, therefore, a time period t2 during which the transistor Q2 is in the on-state (i.e., a time period during which the voltage Vbias is kept at the predetermined value (V1−Vbe2)) is longer than that in the power amplifier circuit of the comparative example, i.e., t1<t2. The average value Vbias_ave of the voltage Vbias is thus larger than the average value Vbias'_ave of the voltage Vbias' in the comparative example. In the power amplifier circuit 100A, as illustrated in FIG. 3A, the decrease in the voltage Vbias and the decrease in the base voltage of the transistor Q1 within an area where the power level of the input power Pin is comparatively high are less than those in the power amplifier circuit of the comparative example. That is, as illustrated in FIG. 3B, the power amplifier circuit 100A may experience less gain compression and have improved linearity of power gain.

Referring back to FIG. 1, a description will be given of the impedance on the bias circuit 110A side viewed from the input terminal. For example, as disclosed in Japanese Unexamined Patent Application Publication No. 2003-324325, in a configuration that does not include the transistor Q3 or the resistance element R2, the capacitor C2 may cause impedance mismatching between the input terminal and the transistor Q1, which may lead to a reduction in power-added efficiency or a reduction in power gain. For example, in a power amplifier circuit including two stages of amplifiers in which the transistor Q1 is included in the amplifier in the last stage, impedance mismatching between the stages may occur. In the power amplifier circuit 100A, in contrast, the base of the transistor Q3 and the resistance element R2 are connected to the end of the capacitor C2 that is farther from the input terminal. The base of a transistor typically has comparatively high impedance. Accordingly, in the power amplifier circuit 100A, the impedance on the capacitor C2 side relative to the impedance on the capacitor C1 side, as viewed from the input terminal, is higher than that in the configuration disclosed in Japanese Unexamined Patent Application Publication No. 2003-324325. The influence of the capacitor C2 on impedance matching between an amplifier and a circuit preceding the amplifier can thus be prevented or reduced. In other words, the power amplifier circuit 100A can perform impedance matching between an amplifier and a preceding circuit with improved linearity of power gain.

Figure 4:
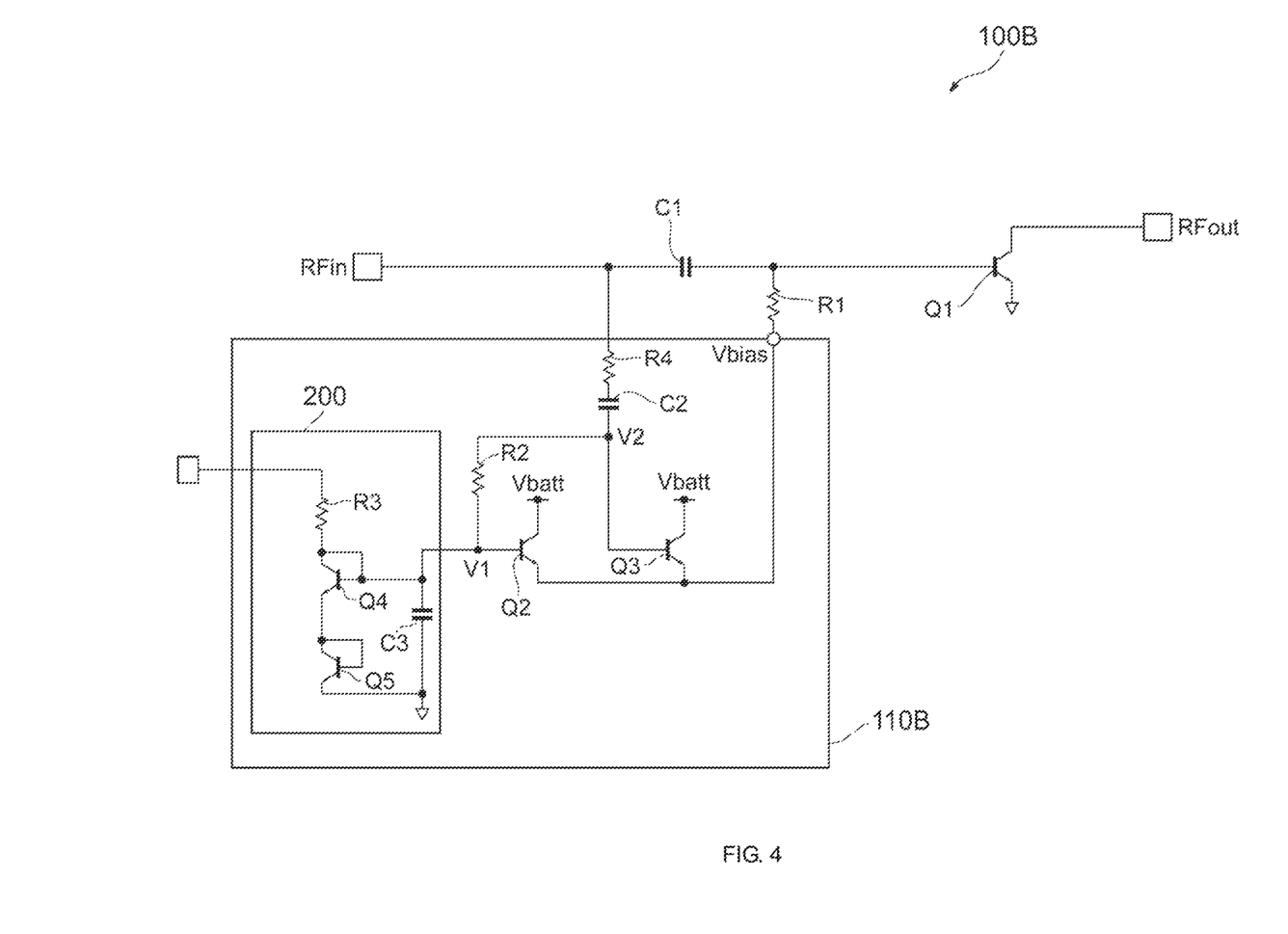
FIG. 4 is a diagram illustrating an example configuration of a power amplifier circuit according to a second embodiment of the present disclosure.

FIG. 4 is a diagram illustrating an example configuration of a power amplifier circuit 100B according to a second embodiment of the present disclosure. The same or substantially the same elements as those of the power amplifier circuit 100A are assigned the same numerals and are not described. Features common to the second embodiment and the first embodiment are not described, and only the differences are described. In particular, similar effects achieved using similar configurations will not be repeatedly described in the individual embodiments.

As illustrated in FIG. 4, the power amplifier circuit 100B includes a bias circuit 110B instead of the bias circuit 110A of the power amplifier circuit 100A. Specifically, unlike the bias circuit 110A, the bias circuit 110B further includes a resistance element R4.

The resistance element R4 (third resistance element) is connected in series with the capacitor C2. The resistance value of the resistance element R4 can be adjusted to adjust the level at which the capacitor C2 detects the input signal RFin.

The configuration described above enables the power amplifier circuit 100B to perform impedance matching between an amplifier and a preceding circuit with improved linearity of power gain in a manner similar to that of the power amplifier circuit 100A.

Figure 5:
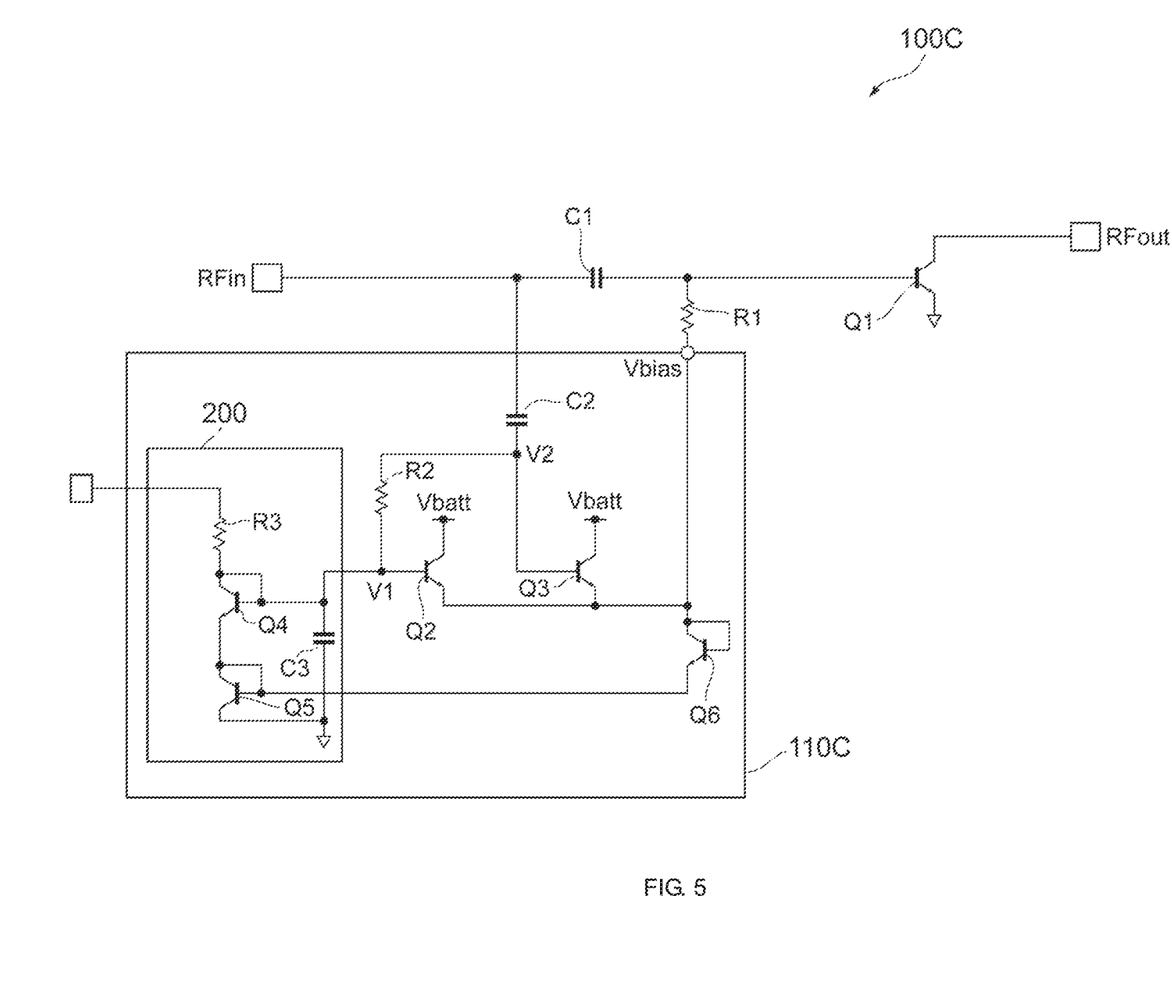
FIG. 5 is a diagram illustrating an example configuration of a power amplifier circuit according to a third embodiment of the present disclosure.

FIG. 5 is a diagram illustrating an example configuration of a power amplifier circuit 100C according to a third embodiment of the present disclosure. The same or substantially the same elements as those of the power amplifier circuit 100A are assigned the same numerals and are not described.

As illustrated in FIG. 5, the power amplifier circuit 100C includes a bias circuit 110C instead of the bias circuit 110A of the power amplifier circuit 100A. Specifically, unlike the bias circuit 110A, the bias circuit 110C further includes a transistor Q6.

The transistor Q6 (third transistor) is diode-connected. The transistor Q6 has a collector connected to the emitters of the transistors Q2 and Q3, and an emitter connected to a base of the transistor Q5. That is, the emitter of the transistor Q6 is supplied with a base-emitter voltage Vbe5 (third direct-current voltage) of the transistor Q5. The function of the transistor Q6 will be described with reference to FIG. 6A and FIG. 6B.

Figure 6A:
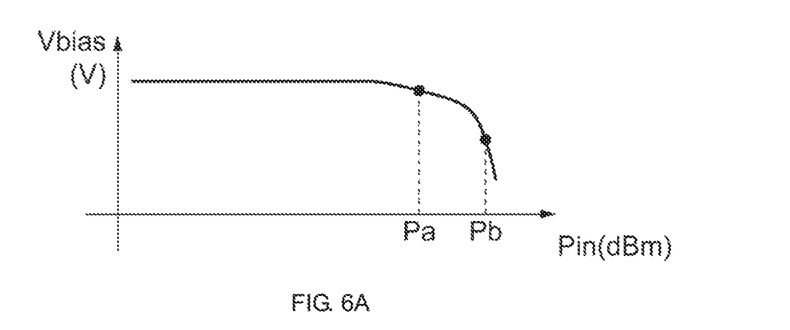
FIG. 6A is a graph depicting a relationship between an input power and a voltage in the power amplifier circuit according to the third embodiment of the present disclosure.
Figure 6B:
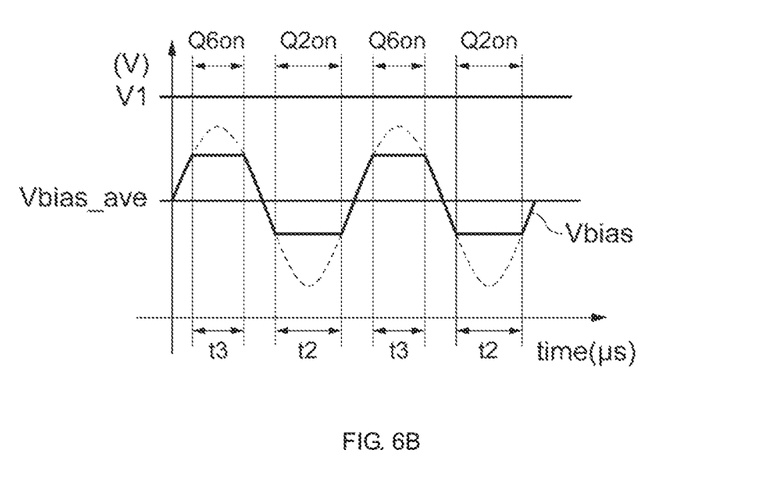
FIG. 6B is a graph depicting a change in voltage with time at an input power level in the power amplifier circuit according to the third embodiment of the present disclosure.

FIG. 6A is a graph depicting a relationship between the input power Pin and the voltage Vbias in the power amplifier circuit 100C according to the third embodiment of the present disclosure, and FIG. 6B is a graph depicting a change in the voltage Vbias with time at an input power level Pb in the power amplifier circuit 100C according to the third embodiment of the present disclosure. The input power level Pb refers to a comparatively high power level of the input signal RFin, at which, for example, the transistor Q1 operates in saturated mode.

In the power amplifier circuit 100C, as illustrated in FIG. 6B, in addition to the on- and off-states of the transistor Q2, the on- and off-states of the transistor Q6 are also switched. That is, when the collector voltage of the transistor Q6 increases in accordance with the signal amplitude of the input signal, the transistor Q6 is brought into an on-state. During a period over which the transistor Q6 is in the on-state (time t3), the waveform of the voltage Vbias remains at a predetermined value. Specifically, the voltage Vbias is kept at a value obtained by adding together the base-emitter voltage (Vbe5) of the transistor Q5 and the base-emitter voltage (Vbe6) of the transistor Q6, i.e., at the value given by Vbe5+Vbe6.

In the power amplifier circuit 100C, accordingly, the transistor Q2 is turned on in response to a decrease in the voltage Vbias, and the transistor Q6 is turned on in response to an increase in the voltage Vbias. With this configuration, when the transistor Q1 operates in saturated mode, the average value of the voltage Vbias is smaller than that in a configuration that does not include the transistor Q6 (see FIGS. 6B and 3C). In the power amplifier circuit 100A, as illustrated in FIG. 3A, the voltage Vbias excessively increases in saturated mode which leads to an improvement of the linearity of power gain, whereas the power-added efficiency may be lowered. In the power amplifier circuit 100C, in contrast, as illustrated in FIG. 6A, the excessive increase in the voltage Vbias in saturated mode is suppressed and the power-added efficiency can be improved.

The configuration described above enables the power amplifier circuit 100C to perform impedance matching between an amplifier and a preceding circuit with improved linearity of power gain in a manner similar to that of the power amplifier circuit 100A. In addition, with the use of the transistor Q6, the power amplifier circuit 100C can improve power-added efficiency, compared with the power amplifier circuits 100A and 100B, in an area where the power level of the input signal is comparatively high.

A diode element may be used instead of the transistor Q6.

As in the power amplifier circuit 100B, the power amplifier circuit 100C may further include the resistance element R4.

Figure 7:
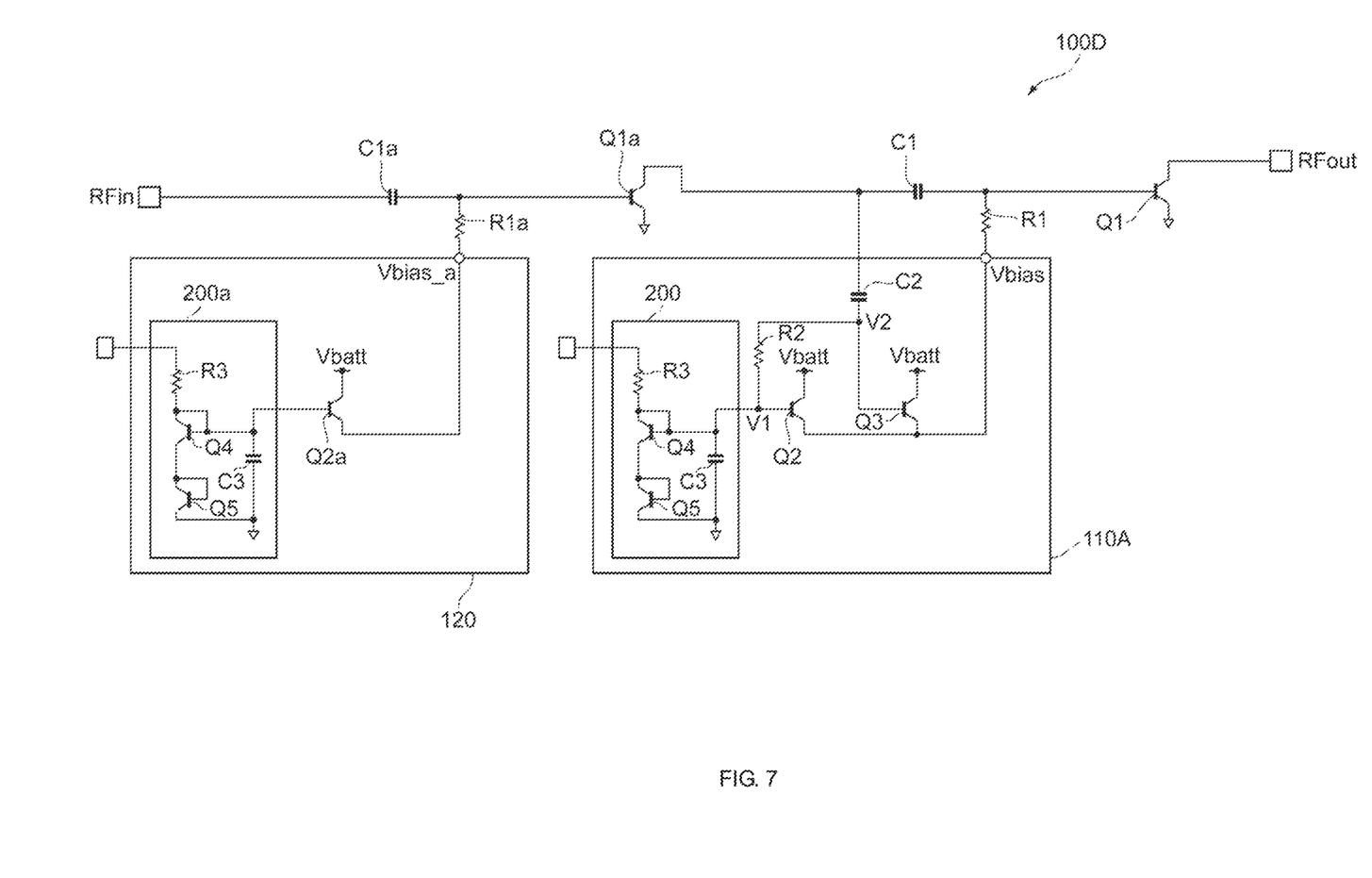
FIG. 7 is a diagram illustrating an example configuration of a power amplifier circuit according to a fourth embodiment of the present disclosure.

FIG. 7 is a diagram illustrating an example configuration of a power amplifier circuit 100D according to a fourth embodiment of the present disclosure. The same or substantially the same elements as those of the power amplifier circuit 100A are assigned the same numerals and are not described.

As illustrated in FIG. 7, unlike the power amplifier circuit 100A, the power amplifier circuit 100D includes multiple stages of amplifiers. Specifically, the power amplifier circuit 100D includes an amplifier in an initial stage (drive stage) and an amplifier in an output stage (power stage).

The initial stage includes a bias circuit 120 instead of the bias circuit 110A, unlike the output stage. In the initial stage, constituent elements corresponding to the constituent elements in the output stage are identified with the corresponding numerals and the subscript "a" and are not described herein.

The bias circuit 120 does not include the transistor Q3, the capacitor C2, or the resistance element R2, unlike the bias circuit 110A. That is, in the amplifier in the initial stage, a bias current or voltage is supplied from the emitter of the transistor Q2a to the base of the transistor Q1a via the resistance element R1a. In the bias circuit 120, the average value Vbias_ave of the voltage Vbias can decrease with an increase in the power level of the input signal RFin. However, such a decrease may have a small effect in the initial stage since the power level of the signal to be amplified in the initial stage is lower than that in the output stage.

The configuration described above enables the power amplifier circuit 100D to match the output impedance of the amplifier in the initial stage with the input impedance of the amplifier in the output stage with improved linearity of power gain in a manner similar to that of the power amplifier circuit 100A.

As illustrated in FIG. 7, a configuration in which multiple stages of amplifiers are connected may include any of the combinations of the bias circuit 120 and the bias circuits 110A to 110C described above. For example, any one of the bias circuits 110A to 110C may be used for an amplifier in an initial stage, and the bias circuit 120 may be used for an amplifier in a subsequent stage. Alternatively, any one of the bias circuits 110A to 110C may be used for the amplifier in each of the initial stage and the subsequent stage.

Additionally, the number of stages of amplifiers to be connected is not limited to two, and three or more stages of amplifiers may be connected.

Exemplary embodiments of the present disclosure have been described. In the power amplifier circuits 100A to 100D, the bias circuits 110A to 110C include the transistor Q2 that supplies a bias current or voltage to the base of the transistor Q1, the transistor Q3 that amplifies the input signal RFin supplied from a signal supply circuit (for example, the capacitor C2) and that outputs the amplified signal to the emitter of the transistor Q2, and an impedance circuit (for example, the resistance element R2) connected between the bases of the transistors Q2 and Q3. This configuration can suppress a reduction in the voltage Vbias and improve the linearity of power gain. In addition, the impedance on the capacitor C2 side viewed from the input terminal is high, and the effect of the capacitor C2 on impedance matching between an amplifier and a circuit preceding the amplifier can thus be prevented or reduced. Accordingly, the power amplifier circuits 100A to 100D can perform impedance matching between an amplifier and a preceding circuit with improved linearity of power gain, compared with the configuration disclosed in Japanese Unexamined Patent Application Publication No. 2003-324325.

As illustrated in, for example, FIG. 1, the impedance circuit may be constituted by a resistance element. The impedance circuit may have any other configuration.

As illustrated in, for example, FIG. 1, furthermore, the signal supply circuit may be constituted by a capacitor. The signal supply circuit may have any other configuration.

The power amplifier circuit 100B further includes the resistance element R4 connected in series with the capacitor C2. Thus, the resistance value of the resistance element R4 can be adjusted to adjust the level at which the capacitor C2 detects the input signal RFin.

The power amplifier circuit 100C further includes the transistor Q6 that is diode-connected and that has a collector connected to the emitters of the transistors Q2 and Q3. This configuration reduces the average value of the voltage Vbias, compared with a configuration that does not include the transistor Q6. In the power amplifier circuit 100C, thus, an excessive increase in the voltage Vbias can be suppressed and the power-added efficiency can be improved.

As illustrated in FIG. 5, the emitter of the transistor Q6 may be connected to the base of the transistor Q5 of the voltage generation circuit 200. The transistor Q6 may have any other configuration.

The embodiments described above are intended to help easily understand the present disclosure, and are not to be used to construe the present disclosure in a limiting fashion. Various modifications or improvements can be made to the present disclosure without necessarily departing from the gist of the present disclosure, and equivalents thereof are also included in the present disclosure. That is, the embodiments may be appropriately modified in design by those skilled in the art, and such modifications also fall within the scope of the present disclosure so long as the modifications include the features of the present disclosure. For example, the elements included in the embodiments described above and the arrangement, materials, conditions, shapes, sizes, and the like thereof are not limited to those described in the illustrated examples but can be modified as appropriate. Furthermore, the elements included in the embodiments can be combined as much as technically possible, and such combinations of elements also fall within the scope of the present disclosure so long as the combinations of elements include the features of the present disclosure.

While embodiments of the disclosure have been described above, it is to be understood that variations and modifications will be apparent to those skilled in the art without necessarily departing from the scope and spirit of the disclosure. The scope of the disclosure, therefore, is to be determined solely by the following claims.

What is claimed is:

1. A power amplifier circuit comprising:
an amplifier transistor configured to amplify an input signal and output an amplified signal, wherein the input signal is supplied to a base or a gate of the amplifier transistor and the amplified signal is output from a collector or a drain of the amplifier transistor;
a bias circuit configured to supply a bias current or a bias voltage to the base or the gate of the amplifier transistor, the bias circuit comprising:
a voltage generation circuit configured to generate a first direct-current (DC) voltage,
a first transistor, wherein the first DC voltage is supplied to a base or a gate of the first transistor,
a second transistor, wherein a second DC voltage is supplied to a base or a gate of the second transistor and an emitter or a source of the second transistor is connected to an emitter or a source of the first transistor, and
a signal supply circuit disposed between the base or the gate of the amplifier transistor and the base or the gate of the second transistor, the signal supply circuit being configured to supply the input signal to the base or the gate of the second transistor, and
a first resistance element connected in series between the base or the gate of the amplifier transistor and the bias circuit, wherein the bias current or the bias voltage is supplied to the base or the gate of the amplifier transistor from the emitter or the source of the first transistor via the first resistance element.

2. The power amplifier circuit according to claim 1, wherein the signal supply circuit comprises a capacitor connected in series between the base or the gate of the amplifier transistor and the base or the gate of the second transistor.

3. The power amplifier circuit according to claim 2, wherein the signal supply circuit further comprises a third resistance element connected in series with the capacitor.

4. The power amplifier circuit according to claim 1, wherein:
the bias circuit further comprises a third transistor, and
a collector or a drain of the third transistor is connected to a base or a gate of the third transistor, is connected to the emitter or the source of the first transistor, and is connected to the emitter or the source of the second transistor.

5. The power amplifier circuit according to claim 2, wherein:
the bias circuit further comprises a third transistor, and
a collector or a drain of the third transistor is connected to a base or a gate of the third transistor, is connected to the emitter or the source of the first transistor, and is connected to the emitter or the source of the second transistor.

6. The power amplifier circuit according to claim 3, wherein:
the bias circuit further comprises a third transistor, and
a collector or a drain of the third transistor is connected to a base or a gate of the third transistor, is connected to the emitter or the source of the first transistor, and is connected to the emitter or the source of the second transistor.

7. The power amplifier circuit according to claim 4, wherein:
the voltage generation circuit comprises a fourth transistor and a fifth transistor that are connected in series,
a base or a gate of the fourth transistor is connected to a collector or a drain of the fourth transistor, and the first DC voltage is output from the collector or the drain of the fourth transistor,
a base or a gate of the fifth transistor is connected to a collector or drain of the fifth transistor, and an emitter or a source of the fifth transistor is grounded, and
an emitter or a source of the third transistor is connected to the base or a gate of the fifth transistor.

8. The power amplifier circuit according to claim 5, wherein:
the voltage generation circuit comprises a fourth transistor and a fifth transistor that are connected in series,
a base or a gate of the fourth transistor is connected to a collector or a drain of the fourth transistor, and the first DC voltage is output from the collector or the drain of the fourth transistor,
a base or a gate of the fifth transistor is connected to a collector or a drain of the fifth transistor, and an emitter or a source of the fifth transistor is grounded, and
an emitter or a source of the third transistor is connected to the base or the gate of the fifth transistor.

9. The power amplifier circuit according to claim 6, wherein:
the voltage generation circuit comprises a fourth transistor and a fifth transistor that are connected in series,
a base or a gate of the fourth transistor is connected to a collector or a drain of the fourth transistor, and the first DC voltage is output from the collector or the drain of the fourth transistor,
a base or a gate of the fifth transistor is connected to a collector or a drain of the fifth transistor, and an emitter or a source of the fifth transistor is grounded, and
an emitter or a source of the third transistor is connected to the base or the gate of the fifth transistor.

10. The power amplifier circuit according to claim 1, wherein:
the voltage generation circuit comprises a fourth transistor and a fifth transistor that are connected in series,
a base or a gate of the fourth transistor is connected to a collector or a drain of the fourth transistor, and the first DC voltage is output from the collector or the drain of the fourth transistor, and
a base or a gate of the fifth transistor is connected to a collector or a drain of the fifth transistor, and an emitter or a source of the fifth transistor is grounded.

\* \* \* \* \*